(12) United States Patent  
Fiebranz

(10) Patent No.: US 8,125,145 B2  
(45) Date of Patent: Feb. 28, 2012

(54) OLEDS WITH INCREASED LIGHT YIELD

(75) Inventor: Bernd Fiebranz, Muenster (DE)

(73) Assignee: Merck Patent GmbH, Darmstadt (DE)

( * ) Notice: Subject to any disclaimer, the term of this patent is extended or adjusted under 35 U.S.C. 154(b) by 110 days.

(21) Appl. No.: 12/159,650

(22) PCT Filed: Dec. 6, 2006

(86) PCT No.: PCT/EP2006/011686  
§ 371 (c)(1),  
(2), (4) Date: Jun. 30, 2008

(87) PCT Pub. No.: WO2007/076913  
PCT Pub. Date: Jul. 12, 2007

(65) Prior Publication Data  
US 2009/0001883 A1 Jan. 1, 2009

(30) Foreign Application Priority Data  
Jan. 5, 2006 (DE) .......................... 10 2006 000 993

(51) Int. Cl.  
*H01J 1/62* (2006.01)  
*H01J 63/04* (2006.01)

(52) U.S. Cl. .......... 313/506; 313/498; 313/504; 313/512

(58) Field of Classification Search ........... 313/498–512  
See application file for complete search history.

(56) References Cited

U.S. PATENT DOCUMENTS

| | | |
|---|---|---|
| 2003/0020399 A1 | 1/2003 | Moller et al. |
| 2003/0127973 A1 | 7/2003 | Weaver et al. |
| 2003/0164679 A1 | 9/2003 | Hamano et al. |
| 2003/0165666 A1 | 9/2003 | Fujiwara et al. |
| 2004/0007936 A1 | 1/2004 | Cros et al. |
| 2004/0007969 A1 | 1/2004 | Lu et al. |
| 2005/0030629 A1 | 2/2005 | Kursawe et al. |
| 2005/0196528 A1 | 9/2005 | Akiyoshi |
| 2006/0186803 A1* | 8/2006 | Lim et al. ...................... 313/506 |

(Continued)

FOREIGN PATENT DOCUMENTS  
EP 0867104 B1 9/1998  
(Continued)

OTHER PUBLICATIONS

OIDA Optoelectronics Industry Development Association, "Organic Light Emitting Diodes (OLEDs) for General Illumination Update 2002", pp. 25-30 (2002).

(Continued)

*Primary Examiner* — Joseph L Williams  
*Assistant Examiner* — Kevin Quarterman  
(74) *Attorney, Agent, or Firm* — Connolly Bove Lodge & Hutz LLP

(57) ABSTRACT

The present invention relates to OLEDs which have at least one substrate, a 1st electrode, at least one organic light-emitting layer and a 2nd electrode, where either the substrate and the 1st electrode, the 2nd electrode or the substrate and the 1st and 2nd electrodes are transparent, which are characterised in that at least one transparent layer which contains transparent, preferably spherical particles, which protrude at least partially out of the at least one layer is arranged on the substrate and/or the transparent 2nd electrode, to processes for the production thereof, and to the use thereof, in particular in illumination devices and displays.

17 Claims, 6 Drawing Sheets

U.S. PATENT DOCUMENTS

| | | | |
|---|---|---|---|
| 2007/0013291 A1* | 1/2007 | Cok et al. | 313/501 |
| 2007/0273973 A1 | 11/2007 | Kursawe et al. | |
| 2008/0084150 A1* | 4/2008 | Cok | 313/110 |

FOREIGN PATENT DOCUMENTS

| | | |
|---|---|---|
| EP | 1352751 A2 | 10/2003 |
| EP | 1445095 A1 | 8/2004 |
| EP | 1503227 A1 | 2/2005 |
| JP | 2001-100012 A | 4/2001 |
| JP | 2003-100444 A | 4/2003 |
| JP | 2004-164902 A | 6/2004 |
| JP | 2005-509894 A | 4/2005 |
| JP | 2005-276581 A | 10/2005 |
| JP | 2005-284276 A | 10/2005 |
| WO | WO-03/042725 A2 | 5/2003 |
| WO | WO-03/061028 A2 | 7/2003 |
| WO | WO-2005/098986 A1 | 10/2005 |
| WO | WO-2005/104625 A1 | 11/2005 |
| WO | WO-2006/035956 A1 | 4/2006 |

OTHER PUBLICATIONS

Yamasaki et al., "Organic Light-Emitting Device with an Ordered Monolayer of Silica Microspheres as a Scattering Medium", *Applied Physics Letters*, vol. 76, No. 10, pp. 1243-1245 (2000).

Peng et al., "11.4: Coupling Efficiency enhancement of Organic Light Emitting Devices with Refractive Microlens Array on High Index Glass Substrate", *SID 04 Digest*, pp. 158-161 (2004).

Vukusic et al., "Directionally Controlled Fluorescence Emission in Butterflies", *SCIENCE*, vol. 310, p. 1151 (2005).

* cited by examiner

OLED with structured outcoupling layer in the switched-on state

OLEDS WITH INCREASED LIGHT YIELD

RELATED APPLICATIONS

This application is a national stage application (under 35 U.S.C. §371) of PCT/EP2006/011686, filed Dec. 6, 2006, which claims benefit of German application 10 2006 000 993.2, filed Jan. 5, 2006.

The present invention relates to OLEDs (organic light-emitting devices) with increased light outcoupling, to processes for the production thereof, and to the use thereof.

OLEDs have undergone rapid development in recent years. They are increasingly replacing the liquid-crystal displays (LCDs) currently employed. Compared with LCDs, OLEDs have a number of advantages: they are distinguished firstly by a simpler structure and by lower energy consumption. In addition, they have reduced viewing-angle dependence.

The OLEDs currently available have the disadvantage of their excessively short lifetimes, which are necessary, in particular, for long-lived applications, such as, for example, backlighting of LCDs and general room lighting.

However, intensive research is currently being carried out on this problem, on the one hand through the development of novel light-emitting materials having higher stability, but on the other hand also through improvement of the encapsulation of OLEDs. Both result in an increase in the lifetime of OLEDs.

A further approach to increasing the lifetime consists in increasing the efficiency of OLEDs, for example by increasing the light outcoupling of the OLEDs. In this way, it is possible to reduce the power consumption of OLEDs (and thus to save energy) for a constant light output or to increase light outcoupling for the same electrical power.

It is generally known that about 40% of the light generated in the emitter layer is already lost in the internal layer systems, i.e. only 60% of the light generated is able to leave the internal layer system at all (so-called "internal outcoupling"). Likewise, about 40% of the light generated is lost at the substrate/air interface owing to total reflection, meaning that only about 20 to a maximum of 30% of all the light generated exits the OLED at all (so-called "external outcoupling"). The present invention relates to the increase in external outcoupling at the substrate/air interface.

Figure 1:
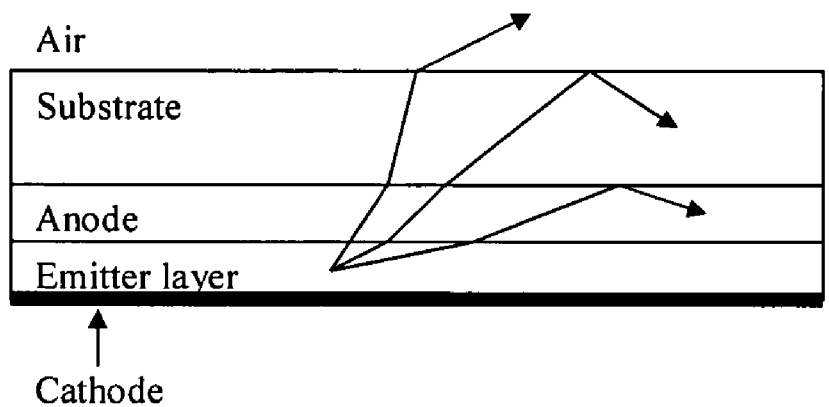
FIG. 1 depicts internal and external outcoupling diagrammatically.

There are various approaches for increasing the external outcoupling efficiency. Thus, for example, surface structures can be applied by means of photolithographic structuring, such as, for example, microlens systems and pyramid structures.

Thus, for example, US 2003/0020399 A1 describes an arrangement of microlenses on OLEDs which have a planar head structure in order to improve the light outcoupling. However, a disadvantage of the planar microlenses is that they do not result in an improvement in outcoupling in the perpendicular.

Roughening of the surface can also be carried out. Furthermore, US 2004/0007969 A1 describes the use of a substrate glass having a relatively high refractive index (n~1.85). The external outcoupling efficiency is also claimed to be improved by coating the substrate surface with a diffuser layer.

However, the ways described of increasing the lifetime of OLEDs and thus their efficiency by reducing radiation loss have the disadvantages of the work involved in structuring, for example in the case of lithographic structuring, and the associated high cost factor, and the poor efficiency improvement, for example in the case of roughening the surface. Although possible replication methods represent a relatively inexpensive alternative to photolithographic structuring, no measures for increasing the external outcoupling efficiency have hitherto been implemented for existing OLED products.

Yamasaki et al. in Applied Physics Letters, Vol. 76, No. 10 (2000) describe OLEDs in which a monolayer of silica microparticles is arranged on the substrate in order to increase outcoupling. The particles here have a diameter of 550 nm. However, the structure described has the disadvantage that diffraction occurs owing to the small particle size. In addition, the particles are only located on the glass and are thus not optically coupled to the substrate. This structure thus merely influences light scattering. Total reflection of the light at the substrate surface remains very substantially unaffected.

OLEDs which have a polymer layer in which microparticles are embedded are described in WO 03/061028 A2. The polymer layer which contains the microparticles is arranged here between the substrate and the anode layer, i.e. within the OLED. The microparticles have a high refractive index of at least 1.7 in order to couple the light generated in the emitter layer into the glass substrate at a steeper angle. Apart from the fact that the arrangement described relates to the "internal outcoupling", the introduction of this particle-containing polymer layer can result in greater roughness of the anode surface, which may adversely affect the properties of the OLED.

An illumination system having a substrate and an active layer which contains an electroluminescent material, where this active layer is provided between a first, optically transparent electrode layer and a second electrode layer, where a light-scattering layer comprising a medium which has light-scattering properties is present on a side of the transparent electrode layer facing away from the active layer, and which is characterised in that the properties of the light-scattering layer are such that the non-scattering fraction of a light beam is in the range between 0.005 and 0.8 when this passes through the light-scattering layer, is disclosed in EP 0 867 104 B1.

Starting from the above-mentioned closest prior art, the object of the present invention can be regarded as the provision of OLEDs which on the one hand have increased external light outcoupling, but on the other hand are distinguished by a simple surface modification which can be produced relatively simply. Simple production in this connection means both inexpensive production and also technically simple production.

The present invention thus relates to an OLED which has at least
  one substrate,
  a 1st electrode,
  at least one organic light-emitting layer, and
  a 2nd electrode,
where at least either
  the substrate and the 1st electrode,
  the 2nd electrode or
  the substrate and the 1st and 2nd electrodes are transparent,
which is characterised in that at least one transparent layer, preferably a transparent layer and particularly preferably a transparent film, which contains transparent, preferably spherical, particles which protrude at least partially out of the at least one layer is arranged on the transparent substrate and/or the transparent 2nd electrode.

In the present application, on the transparent substrate and on the transparent 2nd electrode means on the outer side in each case, i.e. the side opposite the light-emitting layer, of the transparent substrate or the transparent 2nd electrode.

In a first preferred embodiment ("bottom emission" OLED), the OLED has the following structure:
  a transparent substrate,
  a transparent 1st electrode,
  at least one organic light-emitting layer, and
  a 2nd electrode,
which is characterised in that at least one transparent layer, preferably a transparent layer and particularly preferably a transparent film, which contains transparent, preferably spherical, particles which protrude at least partially out of the at least one layer is arranged on the transparent substrate.

In a second preferred embodiment ("top emission" OLED), the OLED has the following structure:
  a substrate,
  a 1st electrode,
  at least one organic light-emitting layer, and
  a transparent 2nd electrode,
which is characterised in that at least one transparent layer, preferably a transparent layer and particularly preferably a transparent film, which contains transparent, preferably spherical, particles which protrude at least partially out of the at least one layer is arranged on the transparent 2nd electrode. The substrate in this embodiment can be transparent, semi-transparent or non-transparent.

In a third preferred embodiment ("transparent" OLED), the OLED has the following structure:
  a transparent substrate,
  a transparent 1st electrode,
  at least one organic light-emitting layer, and
  a transparent 2nd electrode,
which is characterised in that at least one transparent layer, preferably a transparent layer and particularly preferably a transparent film, which contains transparent, preferably spherical, particles which protrude at least partially out of the at least one layer is arranged on the transparent substrate and/or the transparent 2nd electrode. In this embodiment, at least one transparent layer, preferably a transparent layer and particularly preferably a transparent film, which contains transparent, preferably spherical, particles which protrude at least partially out of the at least one layer is particularly preferably arranged on both the transparent substrate and on the transparent 2nd electrode.

In the above-mentioned embodiments, either the 1st electrode can be designed as the anode and the 2nd electrode as the cathode, or vice versa, where the first-mentioned alternative represents the preferred embodiment.

In the above-mentioned embodiments, an encapsulation is particularly preferably additionally arranged on the 2nd electrode, more precisely on the side opposite the light-emitting layer. In the first preferred embodiment ("bottom emission" OLED), the encapsulation can be transparent, semitransparent or non-transparent. In the second and third preferred embodiments, the encapsulation is transparent or semitransparent, preferably transparent. It is particularly preferred in relation to the second and third preferred embodiments for the at least one, preferably one, layer of the encapsulation simultaneously to form the transparent layer which contains the transparent, preferably spherical, particles which protrude at least partially out of the one layer.

The at least one transparent layer according to the invention must meet essentially one requirement. It must have the requisite transparency. The choice of available materials is thus very wide. Accordingly, the materials which can be employed for the at least one transparent layer are all known and commercially available materials, such as, for example, glass, glasslike materials (for example sol-gel systems) and plastics (for example polymer systems), so long as they have the corresponding transparency. Preference is given to plastics. The plastics include, in particular, surface coatings and adhesives.

Suitable surface coatings are all surface coatings known to the person skilled in the art for the use according to the invention, such as, for example, surface coatings which comprise the organic binder dissolved in organic solvents and/or water, and powder coatings. Surface coatings can be characterised here in accordance with various criteria. A corresponding review is given in Römpp Chemie Lexikon [Römpp's Lexicon of Chemistry], Volume: Lacke und Druckfarben [Surface Coatings and Printing Inks], 1998. Preference is given to thermally and UV-curing surface coatings. Preference is furthermore given to varnishes.

Suitable adhesives are likewise all adhesives known to the person skilled in the art for the use according to the invention, such as, for example, physically and/or chemically drying adhesives. A review of physically and chemically drying adhesives is given in Römpp Chemie Lexikon [Römpp's Lexicon of Chemistry], Volume 3, 9th Edition, 1990. Preference is given to thermally and UV-curing adhesives.

The above-mentioned materials for the at least one transparent layer can be employed optimised for the particular type of application (for example spin coating, screen printing and flexographic printing).

The at least one transparent layer here preferably has a layer thickness of 1 µm to 1000 µm. Particular preference is given to layer thicknesses in the range from 2 µm to 200 µm.

Materials which can be employed for the transparent, preferably spherical particles are all known and commercially available particles, so long as they have the corresponding shape, size and transparency. Preferred materials for the transparent particles are glass, plastic and inorganic oxide particles. Thus, for example, glass or plastic particles which are used as spacers in LCD manufacture can be employed. Particular preference is given to silicon dioxide particles, such as the particles described, for example, in the working examples.

The at least one transparent layer which contains the transparent, preferably spherical particles can either cover the entire surface or be structured.

Furthermore, the material for the at least one layer and/or the transparent, preferably spherical particles may also be coloured. The provision of materials for colouring the at least one transparent layer and the transparent particles is known to the person skilled in the art. In this way, it is possible to obtain a coloured outcoupling layer.

In addition, structuring makes it possible to provide certain areas of the OLED with a coloured outcoupling layer. A plurality of different coloured areas can also be displayed on an OLED, for example by repeated application of outcoupling layers of different colours. It is thus possible to combine the increase in light outcoupling with a coloured display on the OLED.

For the purposes of the present invention, transparent means that the material has a light transmission of >60 to 100% at least in part-regions, but preferably over the entire region, of visible light, semitransparent means that the light transmission is in the range from 20 to 60%, and non-transparent means that the light transmission is in the range from 0 to <20%.

The term "at least partially" in relation to the protrusion of the transparent particles out of the one layer means in the present invention that at least 10%, preferably 50% and particularly preferably 90% of the particles partially protrude out of the at least one layer.

The transparent particles arranged in the at least one transparent layer are preferably spherical, i.e. essentially ball-shaped. The transparent, preferably spherical, particles preferably have an average diameter of 1 to 100 µm, particularly preferably an average diameter of 2 to 10 µm. Mixtures of particles of different size distribution are also possible. The refractive index n of the preferably spherical particles varies from 1.3 to 2.0, depending on the nature of the particles. Spherical, i.e. essentially ball-shaped, in the present invention means that the largest diameter of a particle is a maximum of twice as large as the average diameter, and the smallest diameter is a minimum of half as large as the average diameter. The surface roughness of the particles is not restricted in any way, it can extend from very smooth to very rough.

The transparent particles preferably protrude out of the at least one transparent layer with 25 to 75% of their diameter, particularly preferably with 40 to 60% of their diameter and in particular with about 50% of their diameter, i.e. they are in particular approximately half incorporated into the at least one transparent layer, preferably into the one transparent layer and particularly preferably into the one transparent film.

Surprisingly, it has been found that it is possible significantly to increase the external outcoupling of the OLEDs by means of the arrangement according to the invention of the at least one transparent layer which contains transparent, preferably spherical, particles which protrude at least partially out of the at least one layer.

In addition, it is possible to influence the desired properties, such as, for example, spectral properties, through a targeted choice of the size of the particles, the surface roughness of the particles and the refractive indices of the particles and of the at least one transparent layer.

Substrates which can be employed are all materials which are suitable for this purpose. Preferred substrate materials are, however, glass and plastics, where glass is particularly preferred. The glass employed can be all possible types of glass, such as, for example, typical window glass. However, preference is given to the use of flat glasses, as used in the display industry (for example soda-lime glass or alkali-free glass). Plastics which can be employed are all thermoplastics, but preferably polymers, such as, for example, polycarbonate (PC), polymethyl methacrylate (PMMA), polyvinylcarbazole (PVK), polybutadienes, polyethylene (PE), polyethylene terephthalate (PET) and polyester. For "top emission" OLEDs, it is also possible to employ metallic substrates, such as, for example, metallic foils. The thickness of the substrate is not restricted here, but is preferably in the range from 0.05 to 3 mm, particularly preferably in the range from 0.2 to 1.1 mm.

The materials employed for the preferably transparent anode are preferably indium tin oxide (ITO) or also other metal oxides, such as, for example, indium zinc oxide (IZO) or aluminium zinc oxide (AlZnO), but also doped versions of the said oxides (for example fluorine-doped ITO). In addition, a semitransparent, thin metal layer as anode or, in the case of the "top emission" OLED, also a non-transparent anode is also conceivable.

The organic light-emitting layer can have either so-called "small molecules" or polymers as light-emitting materials. The materials which can be employed here are all materials which are known and suitable to the person skilled in the art for this purpose. It is also possible, on use of a plurality of light-emitting materials, for the latter to be arranged in one or more organic light-emitting layers (so-called "multilayers").

In addition, the OLEDs according to the invention may have further functional layers, which can vary depending on the application. Thus, for example, hole-conductor, electron-conductor, injection and/or barrier layers are conceivable. These may preferably be present, but are not absolutely necessary.

The materials employed for the non-transparent or semitransparent cathode are preferably metallic materials, such as, for example, Al, Ag, Au or Cr. In one particularly preferred embodiment, two-layer systems (bilayer) comprising a thin layer of Ba, Li, LiF, Ca or Mg and a layer of a metal are vapour-deposited. The materials employed for transparent or semitransparent cathodes, for example for "top emission" OLEDs or transparent OLEDs, are preferably transparent or semitransparent cathode materials, such as, for example, ITO.

The encapsulation employed can be all materials which are suitable for this purpose. However, preferred encapsulation materials are glass and plastics, where glass is particularly preferred. The glass employed can be all possible types of glass, such as, for example, typical window glass. However, preference is given to the use of flat glasses, as used in the display industry (for example soda-lime glass or alkali-free glass). Particular preference is given to the use of so-called vapour-deposition glasses, as disclosed, for example, in WO 03/088370 A1. Plastics which can be employed are all thermoplastics, but preferably polymers such as, for example, polycarbonate (PC), polymethyl methacrylate (PMMA), polyvinylcarbazole (PVK), polybutadienes, polyethylene (PE), polyethylene terephthalate (PET) and polyester. However, metallic foils can also be employed as encapsulation. In the simplest case, the encapsulation here can consist of a single encapsulation layer, but it is also possible to build up the encapsulation from a plurality of layers. The overall thickness of the encapsulation here is not restricted, but is preferably in the range from 1 µm to 3 mm, particularly preferably in the range from 5 µm to 1.1 mm.

In order to increase light outcoupling, modification of the substrate surface and/or the surface of the 2nd electrode or the encapsulation is necessary in the case of the external outcoupling efficiency (substrate/air interface) in order to reduce the total reflection at the interfacial layer. To this end, a film in which transparent, preferably spherical particles are incorporated is particularly preferably applied to the substrate and/or the surface of the 2nd electrode or the encapsulation in the present invention.

Besides the transparent, preferably spherical particles, it is also possible for a proportion of non-transparent and/or reflective, preferably spherical particles to be embedded in the at least one layer. However, the proportion of non-transparent and/or reflective, preferably spherical particles should not exceed 50%, preferably 25% and particularly preferably 10%. In addition, a proportion of transparent, non-spherical particles, such as, for example, glass flakes, may also be embedded in the at least one layer besides the transparent, preferably spherical particles. However, the proportion of transparent, non-spherical particles should not exceed 50%, preferably 25% and particularly preferably 10%.

It is also possible for at least some of the transparent, preferably spherical particles to be in aggregated form. The aggregation of the particles enables a more diffuse surface to form. This additionally increases external light outcoupling.

The present invention also relates to a process for the production of the OLEDs according to the invention, which is characterised in that at least one, preferably one, transparent layer, particularly preferably a transparent film, in which preferably spherical particles which protrude at least partially out of the at least one layer are incorporated is applied to the substrate and/or the 2nd electrode or the encapsulation of the OLED.

The preferably one transparent layer which contains the transparent, preferably spherical particles can be applied as a film to the substrate and/or the 2nd electrode or the encapsulation used for the OLED production either before the OLED production or thereafter. It is possible here to apply the film in a first step and subsequently to apply the transparent, preferably spherical particles or the film and the transparent, preferably spherical particles together in one step. In two further embodiments, it is possible either to introduce the preferably spherical particles directly into a film or to coat a film with a transparent layer and preferably spherical particles, where the film is then laminated onto the OLED. It is furthermore also possible to treat the substrate and/or the 2nd electrode or the encapsulation directly with the preferably spherical particles before its production.

If a thin-layer encapsulation is employed in a "top emission" OLED or a transparent OLED, this encapsulation can simultaneously also serve as support layer for the preferably spherical particles. However, a transparent protective layer which mechanically stabilises the thin-layer encapsulation is preferably applied to the thin-layer encapsulation. In this case, the transparent protective layer can also serve as support layer for the preferably spherical particles, and the two properties are combined in one layer system. In addition, however, it is also possible additionally to arrange the at least one transparent layer which contains the transparent, preferably spherical particles on the transparent protective layer.

The OLEDs according to the invention can be produced by all processes known to the person skilled in the art. Such processes are, for example, spin, slit, spray and roller coating processes and printing processes, such as, for example, screen, offset and roller printing. The at least one layer can either be applied here in a first step and the transparent, preferably spherical particles can be applied subsequently, or the at least one layer and the transparent, preferably spherical particles are applied together in one step. If the preferably spherical particles are not applied until after the thin-film coating, dry or wet spray processes can be used. Embedding of the transparent, preferably spherical particles by means of ultrasound is also possible. Further processes for the introduction of the transparent, preferably spherical particles are known to the person skilled in the art.

If the at least one transparent layer is applied by means of printing processes (such as, for example, screen, offset and roller printing), it can be applied to the substrate and/or the 2nd electrode with direct structuring. However, it is also conceivable, through the use of a UV-curing system which is applied over the entire surface of the substrate and/or the 2nd electrode (for example by means of spin coating), to cure this system in a structured manner, by mask exposure and to wash off the uncrosslinked areas (typical lithography process). In this way, structuring of the outcoupling layer is possible. It is thus possible, for example, for certain areas, structures and/or characters to be applied to the OLED which then, due to the higher light outcoupling, appear brighter in the switched-on state than the at least one remaining, darker luminous area which does not have increased light outcoupling. However, certain areas, structures and/or characters can also equally well be left out and then appear darker than the at least one remaining luminous area. The structuring here can be obtained by firstly applying the at least one transparent layer and subsequently incorporating the transparent, preferably spherical particles into the at least one layer, where the particles applied in the areas where the at least one layer is not located can easily be removed later. However, it is also possible to apply the particles in a structured manner together with the at least one layer in one process step.

After the application, the curing of the at least one layer which contains the transparent, preferably spherical particles is preferably carried out. The curing here can be carried out by all processes which are known and suitable to the person skilled in the art. However, preference is given to UV curing and thermal curing.

A preferred production process is described below:

After the application of a thin polymer or adhesive layer, the particles are sprayed onto the layer in a dry spraying process. The particles not bound into the layer can then be removed by rinsing with water or by blowing off with compressed air.

The present invention furthermore relates to the use of the OLEDs according to the invention in illumination devices. The term illumination devices here encompasses, for example, general illumination and backlighting of LCDs.

The present invention furthermore relates to the use of the OLEDs according to the invention in displays.

The invention is described in greater detail below with reference to working examples, but without being restricted thereby.

EXAMPLES

Construction of an OLED

An ITO layer with a thickness of about 130 nm is applied as anode (n=1.8) to a glass substrate (thickness: 0.7 mm) having a refractive index of n [589 nm]~1.5 by sputtering. A PEDOT (poly(3,4-ethylenedioxythiophene)) layer (Baytron P AL4083) with a thickness of about 50 nm as hole-injection layer is located thereon. An emitter layer ("Super Yellow", Merck OLED Materials GmbH) with a thickness of about 80 nm is applied to this layer by means of spin coating. A thin barium layer and then a thicker (about 100 nm) aluminium layer are vacuum vapour-deposited as cathode. Finally, the OLED is encapsulated by full-area adhesive bonding of a glass plate in order to minimise the effects of oxygen and atmospheric moisture on the OLED.

Figure 2:
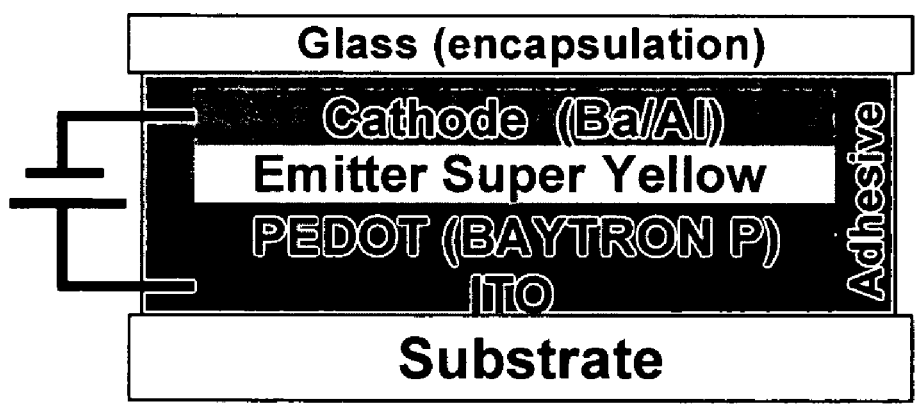
FIG. 2 depicts diagrammatically the typical structure of an OLED, the construction of which is described herein on page 16, lines 3-14.

FIG. 2 shows the typical, diagrammatic structure of an OLED of this type.

Example 1

In order to improve light outcoupling from the OLED substrate, glass spacer beads (diameter about 5 µm) which are used as spacers for the construction of liquid-crystal displays (LCDs) are introduced into a transparent plastic adhesive film. The beads are introduced into the adhesive layer of the plastic adhesive film in such a way that about half protrudes out of the adhesive layer with a thickness of about 20 µm. This film, with the beads protruding in an upward direction, is laminated onto the OLED by means of an immersion oil (n=1.52). The oil prevents an air layer forming between the glass substrate of the OLED and the film, which could then again cause total reflection of the light within the substrate. It is thus ensured that all light rays can also be coupled into the plastic adhesive film. In this way, direct coating of the OLED is made possible by a simple method.

Figure 3:
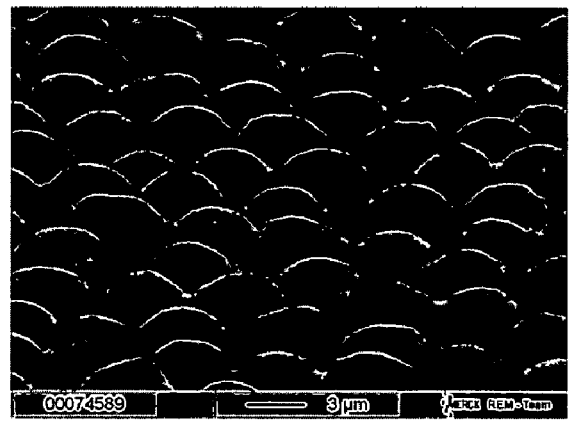
FIG. 3 depicts a scanning electron photomicrograph of the adhesive film from Example 1 with the introduced beads.

FIG. 3 shows a scanning electron photomicrograph of the adhesive film from Example 1 with the introduced beads. The way in which the beads introduced into the adhesive film protrude about half out of the film is clearly evident here.

The angle-dependent, relative light intensity of the OLED produced is measured, once without and once with the layer according to the invention which contains transparent, spherical particles which protrude at least partially out of the at least one layer.

Figure 4:
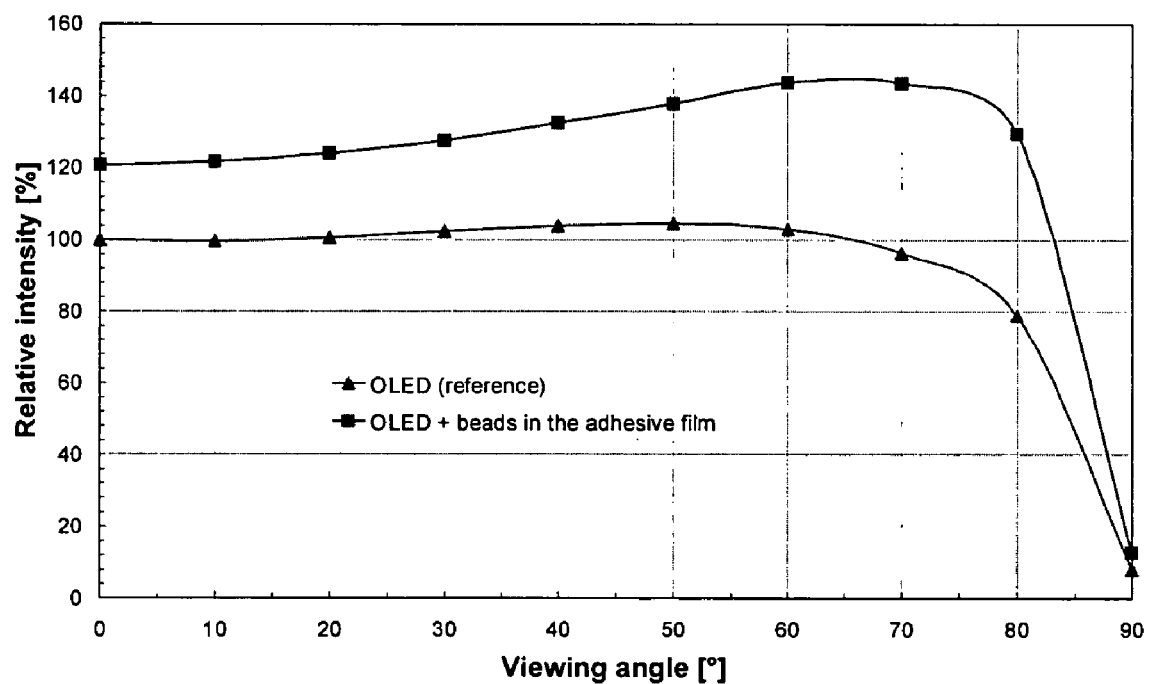
FIG. 4 depicts the improvement in external outcoupling with reference to the measurement of the angle-dependent, relative light intensity of a reference OLED (without the layer according to the invention) and an OLED which has been coated with the layer from Example 1 according to the invention (coupled with immersion oil).

FIG. 4 shows the improvement in external outcoupling with reference to the measurement of the angle-dependent, relative light intensity of a reference OLED (without the layer according to the invention) and an OLED which has been coated with the layer from Example 1 according to the invention (coupled with immersion oil).

The angle of 0° here corresponds to the perpendicular to the OLED substrate. In this perpendicular view, a 20% increase in the light intensity compared with the OLED without the coating according to the invention is obtained. This effect increases and rises to more than 40% at a measurement angle in the range from 60 to 80°.

The spacer beads used in this example have a very narrow diameter distribution and are thus relatively expensive. $SiO_2$ beads having a significantly broader distribution, but which are significantly cheaper, are therefore employed in the following example.

Example 2

$SiO_2$ beads (d~4 to 7 µm) having a relatively large diameter distribution which are produced and marketed by Merck KGaA under the name Ronasphere® LDP are used. These particles are produced on a large scale, for example, as filler for the cosmetics industry (for example for creams) and are therefore relatively inexpensive. The refractive index of these beads is about 1.6. These beads are introduced, analogously to Example 1, into the adhesive layer of an adhesive film and measured on the OLED as described in Example 1.

Figure 5:
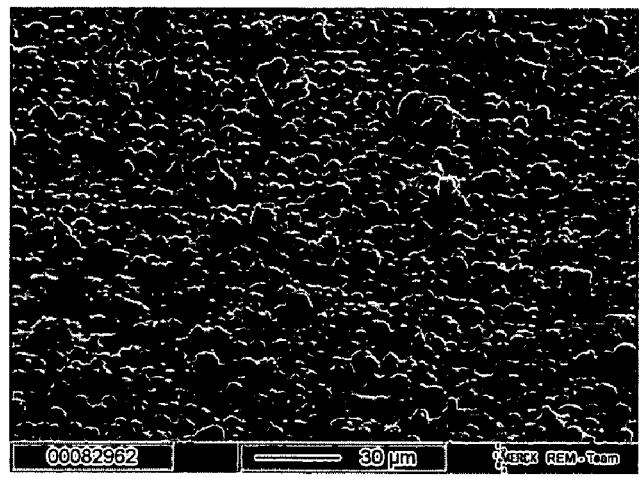
FIG. 5 depicts a scanning electron photomicrograph of the adhesive film from Example 2 with the introduced beads.

FIG. 5 shows a scanning electron photomicrograph of the adhesive film from Example 2 with the introduced beads.

Figure 6:
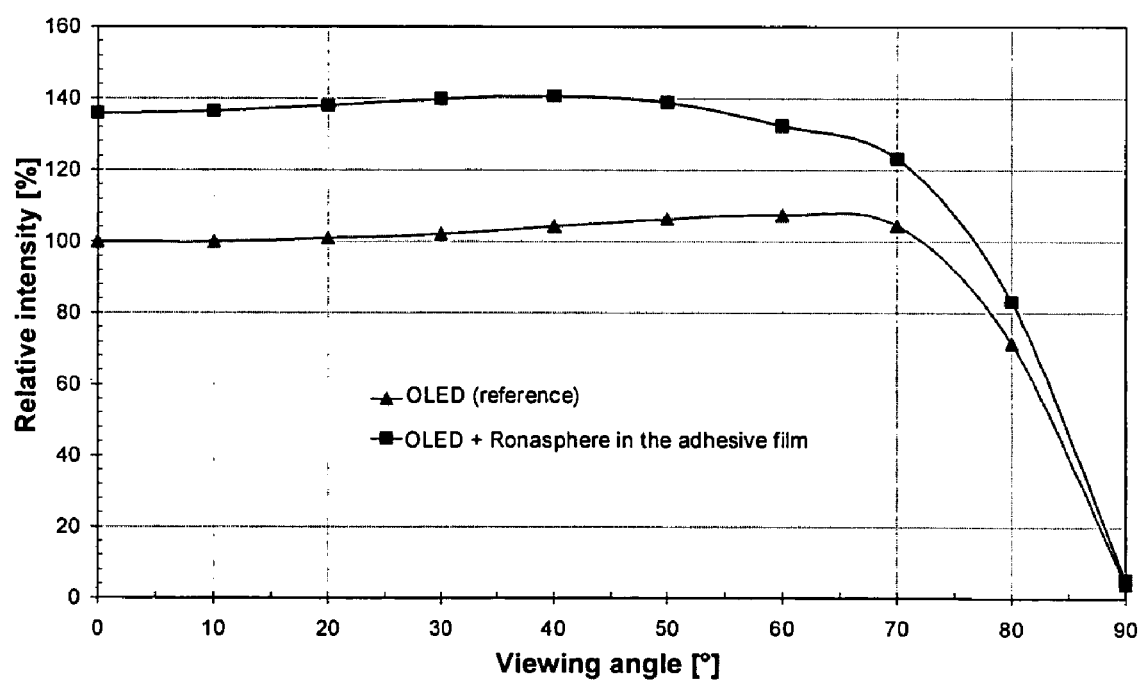
FIG. 6 depicts the improvement in the external outcoupling with reference to the measurement of the angle-dependent, relative light intensity of a reference OLED (without the layer according to the invention) and an OLED which has been coated with the layer from Example 2 according to the invention (coupled with immersion oil).

FIG. 6 shows the improvement in the external outcoupling with reference to the measurement of the angle-dependent, relative light intensity of a reference OLED (without the layer according to the invention) and an OLED which has been coated with the layer from Example 2 according to the invention (coupled with immersion oil).

As shown in FIG. 6, a significant increase in light outcoupling of about 30 to 40% is observed.

Example 3

A transparent polymer layer (LCD top coat) is applied by spin coating to a glass sheet which represents the OLED support. This material is produced by Japan Synthetic Rubber (JSR), Japan, and serves as planarisation layer in LCD coloured-filter production. The solution is prepared by mixing two components (JSR JSS-273A and Optmer JSS-273B) in the weight ratio 6:1 (273A:273B) before use and is applied to the glass plate at 800 rpm. The $SiO_2$ beads from Example 2 are distributed on the wet film, which is still wetted with solvent and has a thickness of about 2 to 3 µm in the dried state, by means of a dry spraying process. This is followed by a 10-minute conditioning step at about 120° C. on a hotplate for evaporation of the solvent and for polymerisation of the top-coat material. In the process, the beads are incorporated into the film and fixed. Ideally, the beads are immersed in the polymer film to half their diameter.

Figure 7:
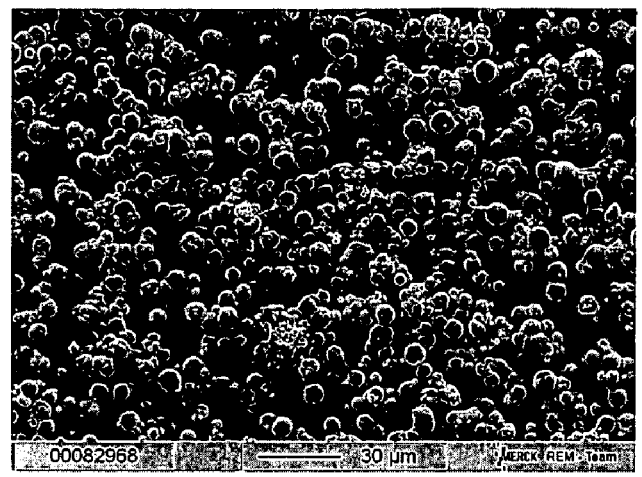
FIG. 7 depicts a scanning electron photomicrograph of the adhesive film from Example 3 with the introduced beads.

FIG. 7 shows a scanning electron photomicrograph of the adhesive film from Example 3 with the introduced beads.

Figure 8:
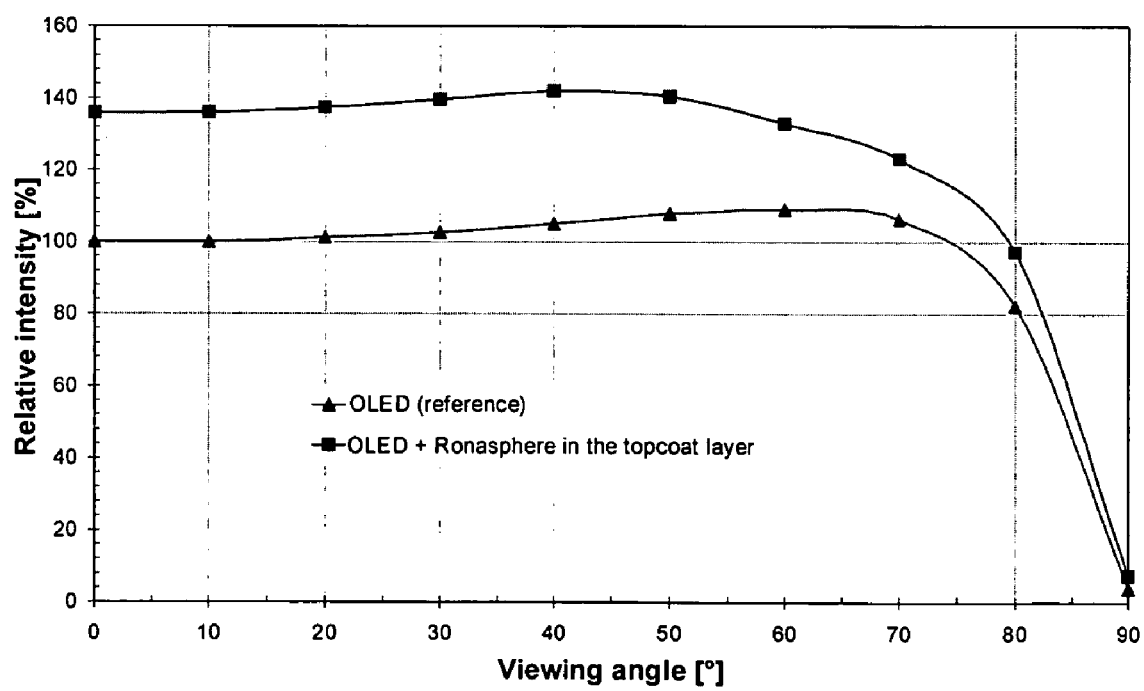
FIG. 8 depicts the improvement in external outcoupling with reference to the measurement of the angle-dependent, relative light intensity of a reference OLED (without the layer according to the invention) and an OLED which has been coated with the layer from Example 3 according to the invention (coupled with immersion oil).

FIG. 8 shows the improvement in external outcoupling with reference to the measurement of the angle-dependent, relative light intensity of a reference OLED (without the layer according to the invention) and an OLED which has been coated with the layer from Example 3 according to the invention (coupled with immersion oil).

As shown by the scanning electron photomicrograph in FIG. 7, some of the transparent, spherical particles are in aggregated form. This aggregation results, as shown in FIG. 8, in a further improvement in external light outcoupling compared with the non-aggregated particles from Examples 1 and 2.

Example 4

The Ronasphere particles described in Example 2 are introduced into a Pröll MZ-Lack 093 screen-printing lacquer in an amount of 40 to 50% by weight, based on the lacquer, and homogeneously distributed in the lacquer. This mixture is printed onto the substrate outside of the OLED in a structured manner with the aid of a screen-printing unit. The layer, which has a total thickness (transparent layer and particles) of about 8 to 10 µm, is cured in an oven at about 60° C. Due to the suitable concentration of particles in the lacquer system, a distribution is achieved in which the transparent particles protrude out of the lacquer layer. Since the structured part of the layer increases light outcoupling of the OLED, this coated area appears brighter in the switched-on state than the remaining uncoated area, which, although likewise luminous, is, however, not as bright.

Figure 9:
FIG. 9 depicts a correspondingly produced OLED with structured outcoupling layer in the switched-on state.
Figure 10:
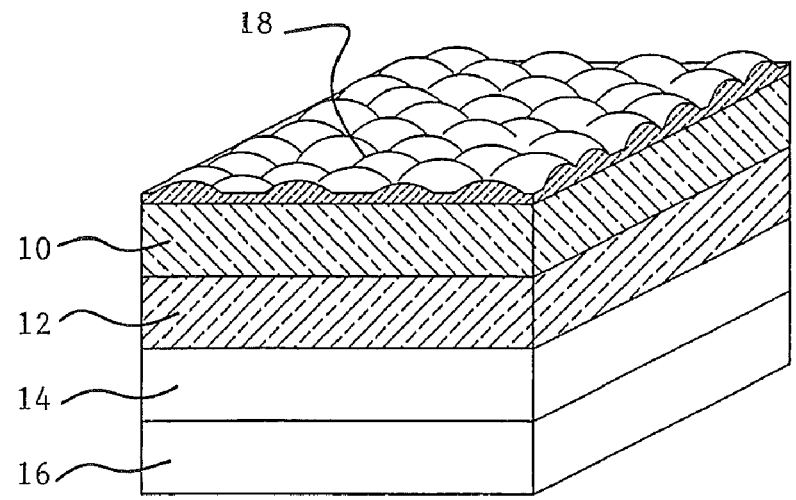
FIG. 10 depicts diagrammatically an embodiment of an OLED according to the invention. The OLED in Figure 10 comprises a transparent substrate 10 a transparent first electrode 12 an organic light emitting layer 14, and a second electrode 16. A transparent layer 18 which comprises transparent particles which protrude at least partially out of the transparent layer 18 is arranged on the transparent substrate 10.
Figure 11:
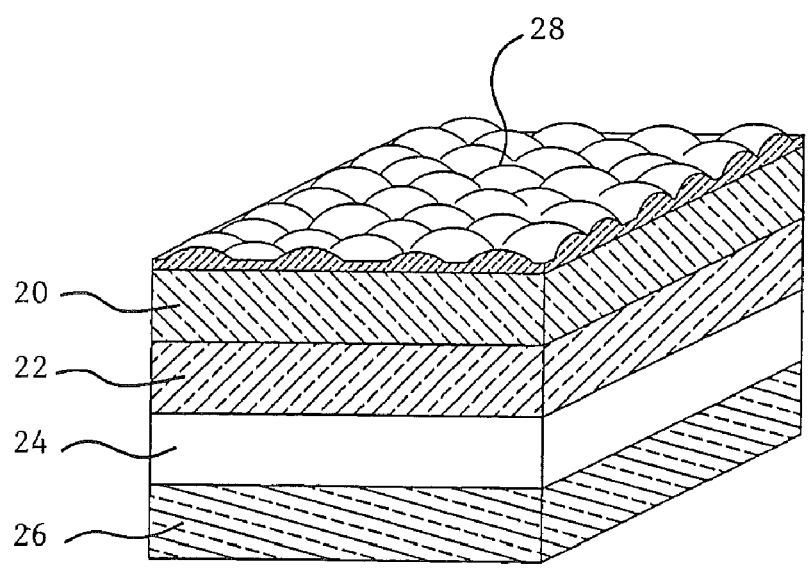
FIG. 11 depicts diagrammatically an embodiment of an OLED according to the invention. The OLED in FIG. 11 comprises a transparent substrate 20, a transparent first electrode 22, an organic light emitting layer 24, and a transparent second electrode 26. A transparent layer 28 which comprises transparent particles which protrude at least partially out of the transparent layer 28 is arranged on the transparent substrate 20.

FIG. 9 shows a correspondingly produced OLED with structured outcoupling layer in the switched-on state.

In addition, it is also possible to give the structured areas a coloured design by colouring the lacquer and/or the particles.

In addition, the characters can in this case also be recognised in the non-switched-on state due to the diffuse appearance, which gives the component an additional positive property. This is because it is possible in this way, for example, to make displays visible in a brighter environment, which are still visible in the dark through the OLED in the switched-on state.

The invention claimed is:

1. An OLED comprising at least one substrate, a first electrode, at least one organic light-emitting layer, and a second electrode, wherein at least (1) said at least one substrate and said first electrode or (2) said at least one substrate and said first and second electrodes are transparent, and wherein at least one transparent layer which comprises transparent particles which protrude at least partially out of said at least one transparent layer is arranged directly on said at least one transparent substrate.

2. The OLED of claim 1, wherein said at least one-substrate and said first electrode are transparent, and wherein said at least one transparent layer which comprises transparent particles which protrude at least partially out of said at least one transparent layer is arranged directly on said at least one transparent substrate.

3. The OLED of claim 1, wherein said at least one substrate, said first electrode, and said second electrode are transparent, and wherein said at least one transparent layer which comprises transparent particles which protrude at least partially out of said at least one transparent layer is arranged directly on said at least one transparent substrate.

4. The OLED of claim 1, wherein a transparent layer is directly arranged on the substrate.

5. The OLED of claim 1, wherein a transparent film is directly arranged on the substrate.

6. The OLED of claim 1, wherein said first electrode is designed as the anode and said second electrode is designed as the cathode.

7. The OLED of claim 1, further comprising an encapsulation arranged on the side of said second electrode opposite the light-emitting layer.

8. The OLED of claim 1, wherein said transparent particles are spherical.

9. The OLED of claim 1, wherein said transparent particles have an average diameter of 1 to 100μm.

10. The OLED of claim 1, wherein said transparent particles protrude out of said at least one transparent layer with from 25 to 75% of their diameter.

11. The OLED of claim 1, wherein said at least one substrate consists of glass.

12. The OLED of claim 1, wherein said at least one transparent layer and/or said transparent particles are coloured.

13. The OLED of claim 1, wherein said at least one transparent layer is structured.

14. A process for producing the OLED of claim 1, comprising applying a transparent film in which transparent particles are at least partially incorporated directly on to said at least one substrate of said OLED.

15. The process of claim 14, wherein said transparent particles are spherical.

16. An illumination device comprising the OLED of claim 1.

17. A display comprising the OLED of claim 1.

* * * * *